United States Patent
Nozawa et al.

(10) Patent No.: US 10,527,931 B2
(45) Date of Patent: *Jan. 7, 2020

(54) MASK BLANK, TRANSFER MASK, METHOD FOR MANUFACTURING TRANSFER MASK, AND METHOD FOR MANUFACTURING SEMICONDUCTOR DEVICE

(71) Applicant: HOYA CORPORATION, Tokyo (JP)

(72) Inventors: Osamu Nozawa, Tokyo (JP); Ryo Ohkubo, Tokyo (JP); Hiroaki Shishido, Tokyo (JP); Yasushi Okubo, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/125,900

(22) Filed: Sep. 10, 2018

(65) Prior Publication Data

US 2019/0004419 A1 Jan. 3, 2019

Related U.S. Application Data

(62) Division of application No. 14/910,854, filed as application No. PCT/JP2014/073498 on Sep. 5, 2014, now Pat. No. 10,101,650.

(30) Foreign Application Priority Data

Sep. 24, 2013 (JP) ................. 2013-196608

(51) Int. Cl.
| | |
|---|---|
| G03F 1/32 | (2012.01) |
| G03F 1/42 | (2012.01) |
| G03F 1/80 | (2012.01) |
| C23C 14/06 | (2006.01) |
| C23C 14/34 | (2006.01) |
| G03F 1/48 | (2012.01) |
| G03F 7/20 | (2006.01) |

(52) U.S. Cl.
CPC ............... *G03F 1/42* (2013.01); *C23C 14/06* (2013.01); *C23C 14/0641* (2013.01); *C23C 14/3414* (2013.01); *G03F 1/32* (2013.01); *G03F 1/48* (2013.01); *G03F 1/80* (2013.01); *G03F 7/20* (2013.01)

(58) Field of Classification Search
CPC ..................................... G03F 1/32; G03F 1/48
USPC ........................................................... 430/5
See application file for complete search history.

(56) References Cited

U.S. PATENT DOCUMENTS

| | | | | |
|---|---|---|---|---|
| 7,767,366 B2 * | 8/2010 | Yoshikawa | ............... | G03F 1/32 430/311 |
| 10,101,650 B2 * | 10/2018 | Nozawa | .................... | G03F 1/32 |
| 2007/0020534 A1 | 1/2007 | Yoshikawa et al. | | |
| 2007/0212618 A1 | 9/2007 | Yoshikawa et al. | | |
| 2009/0220867 A1 * | 9/2009 | Fujikawa | .................. | G03F 1/46 430/5 |
| 2009/0253054 A1 | 10/2009 | Kominato et al. | | |
| 2011/0287346 A1 | 11/2011 | Sakai et al. | | |
| 2011/0305978 A1 | 12/2011 | Iwashita et al. | | |
| 2013/0059235 A1 * | 3/2013 | Inazuki | ..................... | G03F 1/14 430/5 |
| 2013/0059236 A1 | 3/2013 | Shishido et al. | | |
| 2013/0177841 A1 | 7/2013 | Sakai et al. | | |
| 2013/0230796 A1 | 9/2013 | Yoshikawa et al. | | |

FOREIGN PATENT DOCUMENTS

| | | |
|---|---|---|
| JP | 2007-33469 A | 2/2007 |
| JP | 2007-241065 A | 9/2007 |
| JP | 2007-241137 A | 9/2007 |
| JP | 2009-265620 A | 11/2009 |
| JP | 2010009001 A | 1/2010 |
| JP | 2012-3255 A | 1/2012 |
| TW | 200745736 A | 12/2007 |
| TW | 201327029 A1 | 7/2013 |
| TW | 201337449 A | 9/2013 |

(Continued)

OTHER PUBLICATIONS

International Search Report of PCT/JP2014/073498 dated Dec. 9, 2014.

(Continued)

*Primary Examiner* — Daborah Chacko-Davis

(74) *Attorney, Agent, or Firm* — Kilpatrick Townsend & Stockton LLP

(57) ABSTRACT

A mask blank is provided, by which an alignment mark can be formed between a transparent substrate and a laminated structure of a light semitransmissive film, etching stopper film, and light shielding film during manufacture of a transfer mask. The mask blank 100 comprises a structure in which the light semitransmissive film 2, etching stopper film 3, light shielding film 4, and etching mask film 5 are laminated in said order on the transparent substrate 1; the light semitransmissive film 2 and light shielding film 3 are made of a material which can be dry etched with a fluorine-based gas; the etching stopper film and etching mask film are made of a material containing chromium; and when a thickness of the etching stopper film is Ds, an etching rate of the etching stopper film with respect to an oxygen-containing chlorine-based gas is Vs, a thickness of the etching mask film is Dm, and an etching rate of the etching mask film with respect to the oxygen-containing chlorine-based gas is Vm, a relationship: $(Dm/Vm) > (Ds/Vs)$ is satisfied.

20 Claims, 2 Drawing Sheets

(56) References Cited

FOREIGN PATENT DOCUMENTS

WO 2009/123172 A1 10/2009
WO 2012070209 A1 5/2012

OTHER PUBLICATIONS

Communication dated Jun. 13, 2017, from the Japanese Patent Office in counterpart application No. 2016-202849.
Communication dated Jan. 16, 2018, issued by the Intellectual Property Office of Taiwan in counterpart application No. 106124697.

* cited by examiner

[Fig. 1]
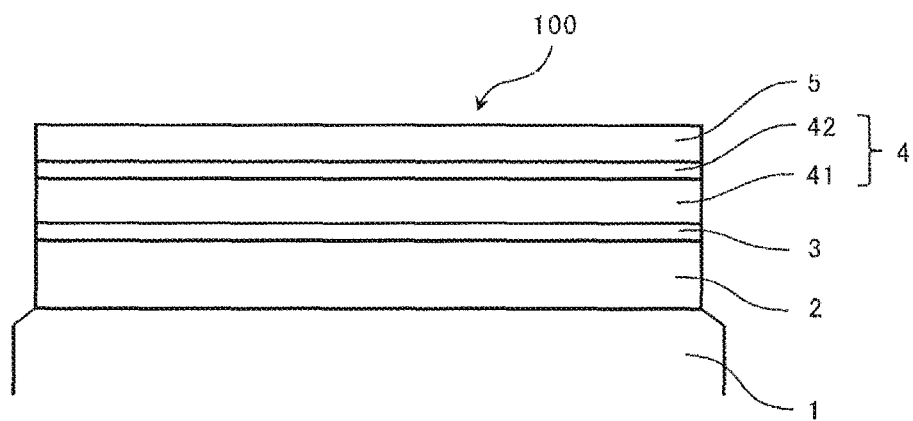
[Fig. 2]
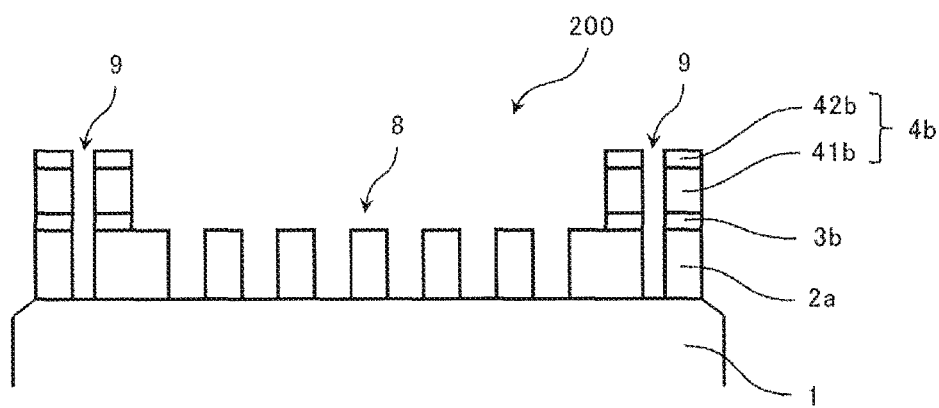

MASK BLANK, TRANSFER MASK, METHOD FOR MANUFACTURING TRANSFER MASK, AND METHOD FOR MANUFACTURING SEMICONDUCTOR DEVICE

CROSS REFERENCE TO RELATED APPLICATIONS

This is a Divisional of application Ser. No. 14/910,854 filed Feb. 8, 2016 claiming priority based on International Application No. PCT/JP2014/073498 filed Sep. 5, 2014, claiming priority based on Japanese Patent Application No. 2013-196608 filed Sep. 24, 2013, the contents of all of which are incorporated herein by reference.

TECHNICAL FIELD

The present invention relates to a mask blank, a transfer mask, and a method for manufacturing the transfer mask.

BACKGROUND

In a manufacturing process of a semiconductor device, a fine pattern is generally formed using a photolithographic method. In the formation of the fine pattern, multiple substrates, which are referred to as transfer masks, are usually used. The transfer mask is formed by providing the fine pattern comprised of a metal thin film, etc. on a generally transparent glass substrate. The photolithographic method is also used in the manufacture of the transfer mask.

Refinement of a pattern for the semiconductor device requires the refinement of a mask pattern formed in the transfer mask as well as shortening of a wavelength of an exposure light source used in photolithography. Recently, the exposure light sources used in the manufacture of semiconductor devices are shifting from KrF excimer lasers (wavelength: 248 nm) to ArF excimer lasers (wavelength: 193 nm), that is, shorter wavelength light sources are increasingly used.

The known types of transfer masks include a binary mask including a light shielding film pattern made of a chromium-based material on a conventional transparent substrate, as well as a half tone phase shift mask. The half tone phase shift mask comprises a light semitransmissive film pattern on the transparent substrate. The light semitransmissive film (half tone phase shift film) has functions for allowing transmission of light at an intensity not substantially contributing to the light exposure and for providing the light transmitted through the light semitransmissive film with a predetermined phase difference with respect to light traveling the same distance through air, thereby generating a so-called phase shift effect.

Generally, in the transfer mask, a periphery region outside the region in which a transfer pattern is formed should ensure optical density (OD) not less than a predetermined value such that, upon the exposure transfer to a resist film on a semiconductor wafer using an exposure apparatus, the resist film will not be affected by the exposure light transmitted through the periphery region. Usually, in the periphery region of the transfer mask, OD is desirably 3 or more, and at least about 2.8 of OD is required. However, the light semitransmissive film of the half tone phase shift mask has a function for allowing the transmission of the exposure light at a predetermined transmittance, and thus, it is difficult to ensure the optical density required for the periphery region of the transfer mask by this light semitransmissive film alone. Therefore, as with the phase shift mask blank disclosed in Patent Document 1, a light shielding film (light blocking film) is laminated onto a semitransparent film having predetermined phase shift amount and transmittance with respect to the exposure light, so that a laminated structure of the semitransparent film and light shielding film ensures the predetermined optical density.

On the other hand, there is a phase shift mask blank in which a light shielding film provided on a phase shift film is formed from a material containing transition metal and silicon, as disclosed in Patent Document 2. In this phase shift mask blank, the material containing transition metal and silicon is also used as a material forming the phase shift film as with the conventional case. Thus, it is difficult to ensure etch selectivity between the phase shift film and light shielding film in the dry etching. Therefore, the phase shift mask blank of Patent Document 2 comprises, between the phase shift film and light shielding film, an etching stopper film made of a material containing chromium. Also, it comprises, on the light shielding film, an etching mask film made of the material containing chromium.

PRIOR ART DOCUMENTS

Patent Documents

Patent Document 1: Japanese Patent Application Publication 2007-033469
Patent Document 2: Japanese Patent Application Publication 2007-241065

SUMMARY OF THE INVENTION

Problems to be Solved by the Invention

In the transfer mask, an alignment mark is usually provided in the periphery region outside the region in which the transfer pattern is formed (transfer pattern forming region). If the transfer mask is fabricated from a mask blank in which a light semitransmissive film allowing the transmission of the exposure light at a predetermined transmittance and the light shielding film are laminated, as disclosed in Patent Documents 1 and 2, the alignment mark may have the following three configurations. The alignment mark having a first configuration is comprised of the light semitransmissive film and transparent substrate. In this case, the alignment mark comprises a configuration in which an alignment mark pattern is formed in the light semitransmissive film, and the light shielding film on and around the alignment mark pattern (including the etching stopper film in case of the mask blank of Patent Document 2) is completely removed. In this instance, an alignment mark detector detects the alignment mark based on the contrast with respect to detection light between the light semitransmissive film and transparent substrate.

The alignment mark having a second configuration is comprised of the transparent substrate and the laminated structure of the light semitransmissive film and light shielding film. In this case, the alignment mark comprises a configuration in which the alignment mark patterns are formed in both the light semitransmissive film and light shielding film. In this instance, the alignment mark detector detects the alignment mark based on the contrast with respect to the detection light between the transparent substrate and the laminated structure of the light semitransmissive film and light shielding film.

The alignment mark having a third configuration is comprised of the light shielding film and light semitransmissive film. In this case, the alignment mark comprises a configuration in which the alignment mark pattern is formed in the light shielding film, and the light semitransmissive film on and around the alignment mark pattern is left without being patterned. In this instance, the alignment mark detector detects the alignment mark based on the contrast with respect to the detection light between the light shielding film and light semitransmissive film.

Among these alignment mark configurations, the highest detection sensitivity is achieved in the second configuration in which the alignment mark patterns are formed in both the light semitransmissive film and light shielding film. In the mask blank whose light shielding film is formed from the material containing chromium as disclosed in Patent Document 1, the light shielding film has sufficient etch selectivity with respect to an etching gas used for patterning the light semitransmissive film, and thus, the alignment mark having the second configuration may be relatively easily formed. However, if the light shielding film does not have etch selectivity with respect to the etching gas used for patterning the light semitransmissive film, as found in the mask blank disclosed in Patent Document 2, it is difficult to form the alignment mark having the second configuration.

The mask blank disclosed in Patent Document 2 comprises a structure in which a phase shift film, an etching stopper film, a light shielding film, an antireflective film, and an etching mask film are laminated in said order on the transparent substrate. The phase shift film, light shielding film, and antireflective film are formed from a material which can be dry etched with a fluorine-based gas (material containing transition metal and silicon). The etching stopper film and etching mask film are formed from the material containing chromium. A process for manufacturing the transfer mask (phase shift mask) from this mask blank is generally as follows.

At first, a first resist film is formed by coating on the etching mask film. A transfer pattern to be formed in the phase shift film is drawn by exposure with an electron beam on the first resist film, and a development procedure, etc. is performed, such that a first resist pattern is formed. By the dry etching with an oxygen-containing chlorine-based gas using this first resist pattern as a mask, the transfer pattern is formed in the etching mask film. Subsequently, by the dry etching with the fluorine-based gas using as a mask the etching mask film having the first resist pattern and transfer pattern, the transfer patterns are formed in the antireflective film and light shielding film. After that, the first resist pattern is removed, and a second resist pattern having a light shielding band pattern (pattern to be formed in each of the etching stopper film, light shielding film, and antireflective film) is formed on the etching mask film. By the dry etching with the oxygen-containing chlorine-based gas, the light shielding band pattern is formed in the etching mask film using the second resist pattern as a mask, and at the same time, the transfer pattern is formed in the etching stopper film using as masks the light shielding film and antireflective film having the respective transfer patterns.

Subsequently, by the dry etching with the fluorine-based gas, the light shielding band patterns are formed in the antireflective film and light shielding film using as masks the second resist pattern and etching mask film, and at the same time, the transfer pattern is formed in the phase shift film using as a mask the etching stopper film having the transfer pattern. Then, the second resist pattern is removed. After that, by the dry etching with the oxygen-containing chlorine-based gas, the etching mask film is removed, and the light shielding band pattern is formed in the etching stopper film using as masks the light shielding film and antireflective film having the respective light shielding band patterns. The method for manufacturing the phase shift mask disclosed in Patent Document 2 is generally carried out in this manner.

However, when used without any change, the mask blank and the method for manufacturing the phase shift mask disclosed in Patent Document 2 only produce the alignment mark having the third configuration (comprised of the light shielding film and light semitransmissive film). If the alignment mark pattern is formed in the first resist pattern, the alignment mark pattern may be formed to the extent of the light shielding film with the first resist pattern. However, since the first resist pattern is removed before formation of the pattern in the etching mask film, and the alignment mark formed in the light shielding film, etc. is filled with the second resist pattern due to the formation of the second resist pattern having the light shielding band pattern, the alignment mark cannot be formed in the etching stopper film during the dry etching as the subsequent process for forming the transfer pattern in the etching stopper film.

Further, when forming the transfer pattern in the phase shift film using the etching stopper film as a mask in the next process, the alignment mark pattern cannot be formed in the phase shift film since the alignment mark pattern has not been formed in the etching stopper film. In the subsequent process for removing the etching mask film, it is possible to form the alignment mark pattern in the etching stopper film. However, since there is no opportunity for forming the alignment mark pattern in the phase shift film, the alignment mark having the third configuration is inevitably produced.

In the method for manufacturing the phase shift mask disclosed in Patent Document 2, if the process is modified such that the first resist pattern is maintained until the transfer pattern is completely formed by the dry etching of the etching stopper film and such that after the light shielding band pattern is formed in the etching mask film by the dry etching using the second resist pattern as a mask and before the dry etching of the antireflective film, etc. is performed, the second resist pattern is removed, the alignment mark having the second configuration may be formed. However, if the first resist pattern is maintained until the dry etching for forming the transfer pattern in the etching stopper film is completed, the first resist film should be thicker, in order for the first resist film to remain even if the dry etching with the oxygen-containing chlorine-based gas, which increases a reduction amount of the resist film thickness, is performed twice (for the etching mask film and for the etching stopper film, respectively).

Recently, further refinement of the transfer pattern for the transfer mask is increasingly demanded. The transfer pattern formed in the resist film when fabricating the transfer mask from the mask blank is also steadily refined, and further reduction of thickness of the resist film is demanded. It is difficult to provide a mask blank capable of being formed into the transfer mask comprising the alignment mark comprised of the transparent substrate and the laminated structure of the light semitransmissive film, etching stopper film, and light shielding film, with the resist film thickness being further reduced than before, and it has been problematic.

If the resist pattern is thin, when the light shielding film or light semitransmissive film is dry etched with the fluorine-based gas while the resist pattern is left after formation of the transfer pattern in the etching mask film, the resist pattern may disappear in the course of the dry etching. If the resist pattern made of an organic material exists during the dry etching, carbon or oxygen is generated by etching the resist pattern, and the generated carbon or oxygen affects an etching environment for the dry etching of the light shielding film or light semitransmissive film. If the resist pattern containing carbon or oxygen disappears in the course of the dry etching of the light shielding film or light semitransmissive film, the etching environment changes during the dry etching, which may undesirably exert a bad influence on pattern accuracy (accuracy of pattern side wall shape or in-plane CD accuracy).

Since the etching gas for dry etching the etching mask film or etching stopper film is different from the etching gas for dry etching the light shielding film or light semitransmissive film, the etching of the etching mask film or etching stopper film and the etching of the light shielding film or light semitransmissive film are often performed in separate respective etching chambers. Generation of carbon or oxygen due to the resist pattern may be a cause for defect generation upon the dry etching. Therefore, it is preferable that after patterning for the etching mask film (patterning of the transfer pattern or light shielding band pattern) is performed and the resist pattern is removed, the mask blank is introduced into an etching chamber for dry etching the light shielding film or light semitransmissive film.

On the other hand, if the dry etching with the oxygen-containing chlorine-based gas, which is performed for forming in the etching stopper film formed from the material containing chromium the transfer pattern to be formed in the light semitransmissive film, is performed while no resist film exists on the etching mask film, the etching mask film may disappear, and it has been problematic.

The present invention was made to solve the existing problems. It is an object of the present invention to provide a mask blank having a structure in which a light semitransmissive film, an etching stopper film, a light shielding film, and an etching mask film are laminated in said order on a transparent substrate, wherein the mask blank may be formed into a transfer mask using a thinner resist pattern, and wherein an alignment mark formed in the transfer mask may be provided with a configuration comprised of the transparent substrate and a laminated structure of the light semitransmissive film, etching stopper film, and light shielding film. It is also an object of the present invention to provide a transfer mask manufactured using this mask blank and a method for manufacturing the transfer mask.

Means of Solving the Problems

The inventors completed the present invention as a result of the earnest study for solving the above problems. The present invention includes the following configurations in order to solve the above problems.

(Configuration 1)

A mask blank having a structure in which a light semitransmissive film, an etching stopper film, a light shielding film, and an etching mask film are laminated in said order on a transparent substrate, wherein the light semitransmissive film is made of a material which can be dry etched with a fluorine-based gas, wherein the etching stopper film and the etching mask film are made of a material containing chromium, wherein the light shielding film is made of a material which can be dry etched with the fluorine-based gas, and wherein when a thickness of the etching stopper film is Ds, an etching rate of the etching stopper film with respect to an oxygen-containing chlorine-based gas is Vs, a thickness of the etching mask film is Dm, and an etching rate of the etching mask film with respect to the oxygen-containing chlorine-based gas is Vm, a relationship indicated by Formula (1) below is satisfied:

$$(Dm/Vm) > (Ds/Vs) \qquad \text{Formula (1).}$$

(Configuration 2)

The mask blank according to Configuration 1, wherein a relationship indicated by Formula (2) below is satisfied:

$$Dm - 2 \cdot Ds \geq (Vm/Vs) \geq 2 \text{ [nm]} \qquad \text{Formula (2).}$$

(Configuration 3)

The mask blank according to Configuration 1 or 2, wherein the etching stopper film is made of a material containing chromium and oxygen.

(Configuration 4)

The mask blank according to any one of Configurations 1 to 3, wherein the etching mask film is made of a material containing chromium and oxygen.

(Configuration 5)

The mask blank according to any one of Configurations 1 to 4, wherein the etching mask film has a thickness greater than a thickness of the etching stopper film.

(Configuration 6)

The mask blank according to any one of Configurations 1 to 5, wherein the light shielding film is made of a material containing tantalum.

(Configuration 7)

The mask blank according to Configuration 6, wherein the light shielding film includes a structure in which a lower layer and an upper layer are laminated in said order from the transparent substrate side, and wherein the upper layer is formed from a material containing tantalum and oxygen.

(Configuration 8)

The mask blank according to any one of Configurations 1 to 5, wherein the light shielding film is made of a material containing transition metal and silicon.

(Configuration 9)

The mask blank according to Configuration 8, wherein the light shielding film includes a structure in which a lower layer and an upper layer are laminated in said order from the transparent substrate side, and wherein the upper layer is formed from a material containing transition metal, silicon, and nitrogen.

(Configuration 10)

The mask blank according to any one of Configurations 1 to 9, wherein the light semitransmissive film is made of a material containing silicon and nitrogen.

(Configuration 11)

A transfer mask, wherein a pattern including a transfer pattern and an alignment mark pattern is formed in the light semitransmissive film of the mask blank according to any one of Configurations 1 to 10, and a pattern including a light shielding band pattern and alignment mark pattern is formed in each of the etching stopper film and light shielding film.

(Configuration 12)

A method for manufacturing a transfer mask using the mask blank according to any one of Configurations 1 to 10, comprising the steps of:

forming on the etching mask film a first resist film having a first pattern including a transfer pattern and an alignment mark pattern to be formed in the light semitransmissive film;

forming the first pattern in the etching mask film by dry etching with an oxygen-containing chlorine-based gas using the first resist film as a mask;

after removing the first resist film, forming the first pattern in the light shielding film by the dry etching with a fluorine-based gas using as a mask the etching mask film having the first pattern;

forming the first pattern in the etching stopper film while leaving the etching mask film having the first pattern by the dry etching with the oxygen-containing chlorine-based gas using as a mask the light shielding film having the first pattern;

forming on the etching mask film a second resist film having a second pattern including a light shielding band pattern to be formed in the light shielding film;

forming the second pattern in the etching mask film by the dry etching with the oxygen-containing chlorine-based gas using the second resist film as a mask;

after removing the second resist film, performing the dry etching with the fluorine-based gas to form the first pattern in the light semitransmissive film using as a mask the etching stopper film having the first pattern and form the second pattern in the light shielding film using as a mask the etching mask film having the second pattern; and performing the dry etching with the oxygen-containing chlorine-based gas to remove the etching mask film and remove the etching stopper film from a region where the light shielding film is not left.

(Configuration 13)

The method for manufacturing a transfer mask according to Configuration 12, wherein in the step of forming the first pattern in the light semitransmissive film, the dry etching with the fluorine-based gas containing no carbon is performed.

(Configuration 14)

The method for manufacturing a transfer mask according to Configuration 13, wherein in the step of forming the first pattern in the light shielding film, the dry etching with the fluorine-based gas containing carbon is performed.

Effect of the Invention

According to the present invention, in fabricating a transfer mask from a mask blank comprising a structure in which a light semitransmissive film, an etching stopper film, a light shielding film, and an etching mask film are laminated in said order on a transparent substrate, a transfer pattern may be formed in the light semitransmissive film using a thinner resist film. Further, according to the present invention, the transfer mask fabricated using the mask blank may have an alignment mark configured from the transparent substrate and a laminated structure of the light semitransmissive film, etching stopper film, and light shielding film.

BRIEF DESCRIPTION OF THE DRAWINGS

FIG. 1 is a cross-sectional view showing a configuration of a mask blank according to an embodiment of the present invention.

FIG. 2 is a cross-sectional view showing a configuration of a transfer mask according to an embodiment of the present invention.

BEST MODE FOR CARRYING OUT THE INVENTION

Figure 3A:
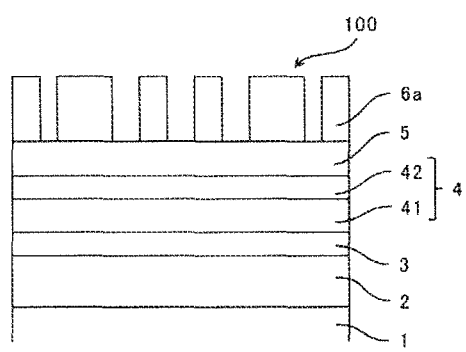
FIGS. 3(A), 3(B), 3(C), 3(D), 3(E), 3(F), 3(G) are cross-sectional views showing a manufacturing process of the transfer mask according to an embodiment of the present invention.

Embodiments of the present invention are described in detail below. FIG. 1 is a cross-sectional view showing a configuration of a mask blank according to an embodiment of the present invention. A mask blank 100 of the present invention shown in FIG. 1 comprises a structure in which a light semitransmissive film 2, an etching stopper film 3, a light shielding film 4, and an etching mask film 5 are laminated in said order on a transparent substrate 1. The light shielding film 4 comprises a structure in which a lower layer 41 and an upper layer 42 are laminated. FIG. 2 is a cross-sectional view showing a configuration of a transfer mask (phase shift mask) according to an embodiment of the present invention. A transfer mask 200 of the present invention shown in FIG. 2 comprises a structure in which the light semitransmissive film having a transfer pattern 8 and an alignment mark pattern formed therein (light semitransmissive pattern 2a), the etching stopper film having a light shielding band pattern and the alignment mark pattern formed therein (etching stopper pattern 3b), and the light shielding film 4 having the light shielding band pattern and alignment mark pattern formed therein (light shielding pattern 4b: lower layer pattern 41b and upper layer pattern 42b) are laminated in said order. The alignment mark 9 is comprised of the transparent substrate 1 and a structure in which the light semitransmissive pattern 2a, etching stopper pattern 3b, and light shielding pattern 4b are laminated.

In the mask blank according to the embodiment of the present invention, the light semitransmissive film 2 is made of a material which can be dry etched with a fluorine-based gas, the etching stopper film 3 and etching mask film 5 are made of a material containing chromium, and the light shielding film 4 is made of the material which can be dry etched with the fluorine-based gas. Further, when a thickness of the etching stopper film 3 is Ds, an etching rate of the etching stopper film 3 with respect to an oxygen-containing chlorine-based gas is Vs, a thickness of the etching mask film 5 is Dm, and an etching rate of the etching mask film 5 with respect to the oxygen-containing chlorine-based gas is Vm, the relationship: $(Dm/Vm) > (Ds/Vs)$ is satisfied.

In the mask blank 100 having the structure in which the light semitransmissive film 2, etching stopper film 3, light shielding film 4, and etching mask film 5 are laminated in said order on the transparent substrate 1, if the light shielding film 4 has low durability to the dry etching with the fluorine-based gas in relation to the light semitransmissive film 2, both the etching stopper film 3 and etching mask film 5 are commonly formed from the material containing chromium. It is because the material containing chromium not only can be patterned by the dry etching with the oxygen-containing chlorine-based gas, but also has high durability to the dry etching with the fluorine-based gas. However, when the transfer mask 200 is fabricated from the mask blank 100 having this configuration, it is difficult to form the alignment mark 9 comprised of the transparent substrate 1 and the laminated structure of the light semitransmissive film 2, etching stopper film 3, and light shielding film 4 (the alignment mark having the second configuration described above).

In order to form this alignment mark 9, a first resist pattern including a transfer pattern to be formed in the light semitransmissive film 2 (fine pattern or auxiliary pattern transferred to a transfer target such as a resist film on a semiconductor device when conducting exposure transfer to the transfer target using an exposure apparatus) should include the alignment mark pattern. The light semitransmissive film 2 is patterned by the dry etching with the fluorine-based gas. Etch selectivity of the transparent substrate 1 with respect to the fluorine-based gas used in the patterning of the light semitransmissive film 2 is not so high. Thus, it is not preferable that a process for forming the alignment mark pattern in the light semitransmissive film 2 is performed after the step of forming the transfer pattern in the light semitransmissive film 2. Accordingly, the alignment mark pattern must be formed when conducting the dry etching for forming the transfer pattern in the light semitransmissive film 2.

In the dry etching step for forming the transfer pattern and alignment mark pattern in the light semitransmissive film 2, the etching stopper film 3 must be used as a mask. Also, in this step, the dry etching for forming a light shielding band pattern in the light shielding film 4 must be performed at the same time. At this step, it is difficult to pattern the light shielding film 4 using as a mask a second resist pattern having the light shielding band pattern. At this step, since the light semitransmissive film 2 must be patterned using as a mask the alignment mark pattern in the etching mask film 5, the second resist pattern must not have been laminated above the alignment mark pattern portion in the etching mask film 5. It is difficult to form the alignment mark pattern as the second resist pattern at the same position as the alignment mark pattern in the etching mask film 5, even with the exposure for drawing by the electron beam.

On the other hand, as described above, it is not preferable that the resist film made of an organic material exists when performing the dry etching with the fluorine-based gas on the light shielding film 4 or light semitransmissive film 2. In view of this, the conclusion is derived that the second resist pattern is used as a mask to form the light shielding band pattern in the etching mask film 5 and the second resist pattern is removed in a pre-step, and then, the step of the dry etching for forming the light shielding band pattern in the light shielding film 4 using as a mask the etching mask film 5 having the light shielding band pattern and the dry etching for forming the transfer pattern and alignment mark pattern in the light semitransmissive film 2 using the etching stopper film 3 as a mask is carried out. In order to perform the above steps, the etching mask film 5 should remain at the step for forming the light shielding band pattern in the light shielding film 4.

In a method for manufacturing a phase shift mask as disclosed in Patent Document 2, the dry etching for forming the transfer pattern in the etching stopper film 3 and the dry etching for forming a light shielding pattern in the etching mask film 5 are performed simultaneously, and thus, absence of the etching mask film 5 at the step for forming the light shielding band pattern in the light shielding film 4 will not occur. However, with this method, an alignment pattern cannot be formed in the etching stopper film 3.

As described above, it is not preferable that the resist film made of the organic material exists when performing the dry etching with the fluorine-based gas for forming the transfer pattern and alignment pattern in the light shielding film 4. Thus, after the dry etching of the etching mask film 5 with the oxygen-containing chlorine-based gas is performed using as a mask the first resist pattern having the transfer pattern and alignment mark pattern, the first resist pattern is removed. However, removal of the first resist pattern gives rise to the possibility that the etching mask film 5 may disappear when performing, as a post-step, the dry etching of the etching stopper film 3 with the oxygen-containing chlorine-based gas using as a mask the light shielding film 4 having the transfer pattern and alignment mark pattern.

In order to solve the above technical problems, the conditions for the etching stopper film 3 and etching mask film 5 should be set such that at least the etching mask film 5 remains upon disappearance of the etching stopper film 3 in the simultaneous dry etching of the etching stopper film 3 and etching mask film 5 with the oxygen-containing chlorine-based gas. In the mask blank according to a first embodiment of the present invention, the following required conditions are set: when the thickness of the etching stopper film 3 is Ds, the etching rate of the etching stopper film 3 with respect to the oxygen-containing chlorine-based gas is Vs, the thickness of the etching mask film 5 is Dm, and the etching rate of the etching mask film 5 with respect to the oxygen-containing chlorine-based gas is Vm, the relationship: (Dm/Vm)>(Ds/Vs) is satisfied. While it is not necessary to specifically limit units for the above respective variables, the unit [nm] for Dm and Ds and the unit [nm/sec] or [nm/min] for Vm and Vs, for example, are preferable.

The required level for the side wall shape accuracy or CD accuracy is lower in the light shielding band pattern formed in the light shielding film 4 than the transfer pattern previously formed in the light shielding film 4. As for the etching mask film 5, when used as a mask in forming the light shielding band pattern in the light shielding film 4, the required level for the side wall shape accuracy or CD accuracy is also low. Thus, after the dry etching for forming the transfer pattern and alignment pattern in the etching stopper film 3, which affects the above-described accuracy, the etching mask film 5 has only to remain, for example, with the thickness of 1 nm or more.

For example, if the same chromium-based material is used for forming the etching stopper film 3 and etching mask film 5, the etching mask film 5 has only to be thicker than the etching stopper film 3 (e.g., by 1 nm). If the etching stopper film 3 and etching mask film 5 are formed by sputtering under the same condition, they have substantially the same composition, film density, and bonding structure as well as substantially the same etching rate with respect to the oxygen-containing chlorine-based gas upon the formation. However, the etching mask film 5 located in the uppermost layer of the mask blank 100 is easily influenced by the cleaning after the film formation or the annealing in atmosphere before and after the resist application. Therefore, at the step of the dry etching of the etching stopper film 3 and etching mask film 5 with the oxygen-containing chlorine-based gas in an actual manufacturing process of the transfer mask 200, the etching stopper film 3 and etching mask film 5 are unlikely to have the same etching rate.

Rather, it is inevitable that the oxidation of the etching mask film 5 progresses much more than the etching stopper film 3 in the preceding step, and thus, the tendency of the etching rate of the etching mask film 5 to become higher easily occurs. In view of these aspects, respective materials and thicknesses for the etching stopper film 3 and etching mask film 5 should be selected.

If there is a need to enhance the side wall shape accuracy or CD accuracy of a light shielding band formed in the light shielding film 4, the thickness of the etching mask film 5 remained after the dry etching for forming the transfer pattern and alignment pattern in the etching stopper film 3 is satisfactorily 2 nm or more. In order for the etching mask film 5 having the thickness of 2 nm or more to be left, the etching stopper film 3 and etching mask film 5 must satisfy the relationship: $Dm-2 \cdot Ds \cdot (Vm/Vs) \geq 2$ [nm]. This mathematical relation is derived assuming that the time required for the dry etching for forming the transfer pattern and alignment pattern in the etching stopper film 3 (total etching time) is twice as long as the time from a commencement of the etching of the etching mask film 5 to first exposure of an upper surface of the light semitransmissive film 2 (just etching time).

Especially, the dry etching of a thin film made of the material containing chromium with the oxygen-containing chlorine-based gas has weak anisotropy, and thus, when the dry etching first reaches a lower end of the thin film, verticality of the pattern side walls tends to be low. Thus, it is necessary to perform additional etching to enhance the verticality of the pattern side walls, and, for example, the additional etching for the period of time equal to the just etching time is often carried out.

The etching stopper film 3 is used as a mask in the dry etching for forming the transfer pattern in the light semitransmissive film 2. The required level for the side wall shape accuracy or CD accuracy of the light semitransmissive pattern 2a is high. The required level for the side wall shape accuracy or CD accuracy of the transfer pattern formed in the etching stopper film 3 used as a mask in the dry etching for forming the light semitransmissive pattern 2a is also high. In order to satisfy these required levels, the etching stopper film 3 should have a certain thickness or more, that is, the thickness should be 3 nm or more, and is preferably 5 nm or more. On the other hand, the etching mask film 5 must remain after forming the transfer pattern in the etching stopper film 3, as stated above. The etching mask film 5 is a film in which the transfer pattern is first formed by the dry etching using as a mask the first resist film having the transfer pattern. As the etching mask film 5 becomes thicker, the first resist film must be thicker as well. Since the first resist film, etching mask film 5, and etching stopper film 3 have this mutual relationship, the etching stopper film 3 cannot be thickened excessively. In view of these aspects, the thickness of the etching stopper film 3 is desirably 10 nm or less, and preferably 7 nm or less.

The material used for the etching stopper film 3 and etching mask film 5 may contain other elements, as long as it is the chromium-based material and unless their etching properties significantly change. The material preferred for the etching stopper film 3 and etching mask film 5 includes, for example, a chromium compound in which one or more elements selected from elements such as oxygen, nitrogen, carbon, hydrogen, and boron are added to chromium. In order for the etching mask film 5 to remain after the dry etching for forming the transfer pattern in the etching stopper film 3, the etching stopper film 3 preferably has a higher etching rate with respect to the oxygen-containing chlorine-based gas than the etching mask film 5. The etching stopper film 3 is preferably made of a material containing chromium and oxygen.

The etching mask film 5 is a film in which the transfer pattern and alignment mark pattern are first formed by the dry etching using the first resist film as a mask. The etching mask film 5 with the transfer pattern and alignment mark pattern formed therein is used as a mask when the transfer pattern and alignment mark pattern are formed in the light shielding film 4 by the dry etching. Thus, the required level for the side wall shape accuracy or CD accuracy of the transfer pattern formed in the etching mask film 5 is high. Further, after the dry etching of the light shielding film 4 with the fluorine-based gas and the dry etching of the etching stopper film 3 with the oxygen-containing chlorine-based gas are performed, the etching mask film 5 must remain. In order to meet these requirements, the etching mask film 5 should have a certain thickness or more, that is, the thickness should be 5 nm or more, and is preferably 7 nm or more. On the other hand, as the etching mask film 5 becomes thicker, the first resist film must be thicker as well. Thus, the etching mask film 5 cannot be thickened excessively. In view of these aspects, the thickness of the etching mask film 5 is desirably 20 nm or less, and preferably 15 nm or less.

In order to form the transfer pattern in the etching mask film 5 with great accuracy while reducing the thickness of the first resist film, the etching mask film 5 desirably has a high etching rate with respect to the oxygen-containing chlorine-based gas. Thus, the etching mask film 5 is also preferably made of the material containing chromium and oxygen. The etching mask film 5 encounters more processes of exposure to the etching gas than the etching stopper film 3. In view of this aspect, a chromium content in the material forming the etching mask film 5 is preferably greater than the chromium content in the material forming the etching stopper film 3.

In view of the above, the difference in the chromium content between the etching stopper film 3 and etching mask film 5 is preferably 5 at % or more, more preferably 10 at % or more, and further preferably 15 at % or more. Also, the difference in the chromium content between the etching stopper film 3 and etching mask film 5 is preferably 50 at % or less, more preferably 45 at % or less, and further preferably 40 at % or less.

The material containing chromium tends to have higher durability to the dry etching with the fluorine-based gas as the chromium content in the material increases. Further, the material containing chromium tends to have a higher etching rate in the dry etching with the oxygen-containing chlorine-based gas as the oxygen content in the material increases. Thus, the etching stopper film 3 preferably has a lower chromium content and a higher oxygen content than the etching mask film 5.

In view of the above, the difference in the oxygen content between the etching stopper film 3 and etching mask film 5 is preferably 5 at % or more, more preferably 10 at % or more, and further preferably 15 at % or more. Also, the difference in the oxygen content between the etching stopper film 3 and etching mask film 5 is preferably 40 at % or less, more preferably 30 at % or less, and further preferably 25 at % or less.

The chromium content in the etching stopper film 3 is preferably 70 at % or less, more preferably 60 at % or less, and further preferably 50 at % or less. Also, the chromium content in the etching stopper film 3 is preferably 30 at % or more, more preferably 35 at % or more, and further preferably 40 at % or more. On the other hand, the oxygen content in the etching stopper film 3 is preferably 30 at % or more, more preferably 35 at % or more, and further preferably 40 at % or more. Also, the oxygen content in the etching stopper film 3 is preferably 60 at % or less, more preferably 55 at % or less, and further preferably 50 at % or less.

The chromium content in the etching mask film 5 is preferably 35 at % or more, more preferably 45 at % or more, and further preferably 50 at % or more. Also, the chromium content in the etching mask film 5 is preferably 90 at % or less, more preferably 80 at % or less, and further preferably 70 at % or less. On the other hand, the oxygen content in the etching mask film 5 is preferably 10 at % or more, more preferably 15 at % or more, and further preferably 20 at % or more. Also, the oxygen content in the etching mask film 5 is preferably 50 at % or less, more preferably 40 at % or less, and further preferably 35 at % or less.

The silicon content in the etching stopper film 3 and etching mask film 5 is preferably 10 at % or less, and more preferably 5 at % or less. Especially preferably, the etching stopper film 3 and etching mask film 5 do not contain silicon. It is because the etching rate in the dry etching with the oxygen-containing chlorine-based gas significantly decreases as the silicon content in the etching stopper film 3 and etching mask film 5 increases. It is also because the etch selectivity in the dry etching with the fluorine-based gas decreases.

The material forming at least one of the etching stopper film 3 and etching mask film 5 may contain at least one or more metal elements selected from indium (In), tin (Sn), and molybdenum (Mo) (these metal elements are hereinafter referred to as "metal elements such as indium"). By containing the above metal elements such as indium in the material containing chromium, the etching rate in the dry etching with the oxygen-containing chlorine-based gas may become high, and the decrease in the durability to the dry etching with the fluorine-based gas may be restrained.

Preferable configurations for applying the material containing chromium and metal elements such as indium to at least one of the etching stopper film 3 and etching mask film 5 may include the following.

Configuration (1): only the etching mask film 5 contains the metal elements such as indium, or a ratio of the total contents of the metal elements such as indium I[at %] to the total contents of chromium and metal elements such as indium (Cr+I)[at %] (hereinafter referred to as I/(Cr+I) ratio) is higher in the etching mask film 5 than the etching stopper film 3; and the total contents of chromium and metal elements such as indium are higher in the etching mask film 5 than the etching stopper film 3, and the oxygen content is higher in the etching stopper film 3 than the etching mask film 5.

An increase of the total contents of chromium and metal elements such as indium in the etching mask film 5 improves the durability of the etching mask film 5 with respect to the dry etching with the fluorine-based gas performed for forming in the light shielding film 4 the transfer pattern and alignment mark pattern to be formed in the light semitransmissive film 2 using the etching mask film 5 as a mask.

By increasing the total contents of the metal elements such as indium in the etching mask film 5, the etching rate in the dry etching with the oxygen-containing chlorine-based gas may be higher than the configuration in which only the chromium content is increased to improve the durability of the etching mask film 5 with respect to the dry etching with the fluorine-based gas. This may reduce the thickness of the first resist film used as a mask in the dry etching with the oxygen-containing chlorine-based gas for forming in the etching mask film 5 the transfer pattern and alignment mark pattern to be formed in the light semitransmissive film 2.

In a thin film made of the material containing chromium, a degree of elevation of the etching rate in the dry etching with the oxygen-containing chlorine-based gas caused due to an increase of the oxygen content in the film is significantly greater than the degree of elevation of the etching rate in the dry etching with the oxygen-containing chlorine-based gas caused due to an increase of contents of the metal elements such as indium in the film. Thus, in Configuration (1), the etching rate of the etching stopper film 3 in the dry etching with the oxygen-containing chlorine-based gas is higher than the etching rate of the etching mask film 5 in the dry etching with the oxygen-containing chlorine-based gas. Therefore, the need to significantly increase the thickness of the etching mask film 5 relative to that of the etching stopper film 3 in order to avoid the disappearance of the etching mask film 5 due to the dry etching with the oxygen-containing chlorine-based gas for forming in the etching stopper film 3 the transfer pattern and alignment mark pattern to be formed in the light semitransmissive film 2 is reduced.

In Configuration (1), it is preferable that the etching stopper film 3 and etching mask film 5 have the same thickness, or the thickness of the etching mask film 5 is greater than the etching stopper film 3. The difference in thickness between the etching stopper film 3 and etching mask film 5 is preferably 10 nm or less, more preferably 7 nm or less, and further preferably 5 nm or less.

Configuration (2): only the etching stopper film 3 contains the metal elements such as indium, or the etching stopper film 3 has a higher I/(Cr+I) ratio than the etching mask film 5; and the total contents of chromium and metal elements such as indium are higher in the etching stopper film 3 than the etching mask film 5, and the oxygen content is higher in the etching mask film 5 than the etching stopper film 3.

An increase in the total contents of chromium and metal elements such as indium in the etching stopper film 3 improves the durability of the etching stopper film 3 with respect to the dry etching with the fluorine-based gas performed for forming in the light shielding film 4 the transfer pattern and alignment mark pattern to be formed in the light semitransmissive film 2 using the etching stopper film 3 as a mask. Since the durability to the dry etching of a pattern edge portion in the etching stopper film 3 with the fluorine-based gas improves, a pattern may be formed in the light semitransmissive film 2 with great accuracy even if the thickness of the etching stopper film 3 is further reduced (e.g., to 5 nm or less).

Since the etching stopper film 3 contains an abundance of metal elements such as indium, a degree of decrease of the etching rate in the dry etching of the etching stopper film 3 with the oxygen-containing chlorine-based gas caused due to the high total contents of chromium and metal elements such as indium is lowered. Further, as described above, since the thickness of the etching stopper film 3 may be further decreased, the total etching time in the dry etching of the etching stopper film 3 with the oxygen-containing chlorine-based gas may be equal to or less than the total etching time in the other configurations. Thus, even if the thickness of the etching mask film 5 is not significantly increased, the etching mask film 5 does not disappear upon the dry etching with the oxygen-containing chlorine-based gas performed for forming in the etching stopper film 3 the transfer pattern and alignment mark pattern to be formed in the light semitransmissive film 2.

In Configuration (2), the thickness of the etching mask film 5 is preferably greater than that of the etching stopper film 3. The difference in thickness between the etching stopper film 3 and etching mask film 5 is preferably 3 nm or more, and more preferably 5 nm or more. The difference in thickness between the etching stopper film 3 and the etching mask film 5 is preferably 15 nm or less, more preferably 10 nm or less, and further preferably 7 nm or less.

Configuration (3): only the etching mask film 5 contains the metal elements such as indium, or the etching mask film 5 has a higher I/(Cr+I) ratio than the etching stopper film 3; and the total contents of chromium and metal elements such as indium are higher in the etching stopper film 3 than the etching mask film 5, and the oxygen content is higher in the etching mask film 5 than the etching stopper film 3.

In this configuration, the etching rate in the dry etching with the oxygen-containing chlorine-based gas is significantly higher in the etching mask film 5 than the etching stopper film 3. Also, since the etching stopper film 3 has a low oxygen content and a high chromium content, the durability to the dry etching with the fluorine-based gas performed for forming the transfer pattern and alignment mark pattern in the light semitransmissive film 2 is significantly high. Further, since the durability to the dry etching of the pattern edge portion in the etching stopper film 3 with the fluorine-based gas improves, a pattern may be formed in the light semitransmissive film 2 with great accuracy even if the thickness of the etching stopper film 3 is further reduced (e.g., to 5 nm or less).

In Configuration (3), the thickness of the etching mask film 5 is preferably greater than the thickness of the etching stopper film 3. The difference in thickness between the etching stopper film 3 and etching mask film 5 is preferably 5 nm or more, and more preferably 7 nm or more. The difference in thickness between the etching stopper film 3 and etching mask film 5 is preferably 20 nm or less, more preferably 15 nm or less, and further preferably 10 nm or less.

Configuration (4): only the etching stopper film 3 contains the metal elements such as indium, or the etching stopper film 3 has a higher I/(Cr+I) ratio than the etching mask film 5; and the total contents of chromium and metal elements such as indium are higher in the etching mask film 5 than the etching stopper film 3, and the oxygen content is higher in the etching stopper film 3 than the etching mask film 5.

In this configuration, the etching rate in the dry etching with the oxygen-containing chlorine-based gas is significantly higher in the etching stopper film 3 than the etching mask film 5, and the difference in etching rate therebetween is the largest among Configurations (1) to (4). When the light shielding band pattern is formed in the etching mask film 5 by the dry etching with the oxygen-containing chlorine-based gas using the second resist pattern as a mask, the dry etching using the light shielding film 4 as a mask is concurrently performed on the etching stopper film 3, and then, the transfer pattern is formed in the etching stopper film 3. If the transfer pattern is formed early in the etching stopper film 3 at this stage, the side etching progresses from pattern side walls of the etching stopper film 3 while the dry etching for forming the light shielding band pattern in the etching mask film 5 is subsequently continuously performed. As a result, the CD accuracy of the transfer pattern formed in the etching stopper film 3 is significantly reduced.

From the above, the thickness of the etching stopper film 3 is preferably greater than that of the etching mask film 5 in Configuration (4). The difference in thickness between the etching stopper film 3 and etching mask film 5 is preferably 3 nm or more, and more preferably 5 nm or more. The difference in thickness between the etching stopper film 3 and etching mask film 5 is preferably 15 nm or less, more preferably 10 nm or less, and further preferably 7 nm or less.

In Configurations (1) to (4), the difference in I/(Cr+I) ratio between the etching stopper film 3 and etching mask film 5 is preferably 3% or more, more preferably 5% or more, and further preferably 7% or more. Also, the difference in I/(Cr+I) ratio between the etching stopper film 3 and etching mask film 5 is preferably 45% or less, more preferably 40% or less, and further preferably 30% or less. In Configurations (1) to (4), the I/(Cr+I) ratio in the etching stopper film 3 and etching mask film 5 is preferably 50% or less, more preferably 30% or less, and further preferably 20% or less. It is because the metal elements such as indium have lower durability to chemical cleaning or cleaning with warm water than chromium.

In Configurations (1) and (4), the difference in total contents of chromium and metal elements such as indium between the etching stopper film 3 and etching mask film 5 is preferably 5 at % or more, more preferably 10 at % or more, and further preferably 15 at % or more. Also, the difference in total contents of chromium and metal elements such as indium between the etching stopper film 3 and etching mask film 5 is preferably 50 at % or less, more preferably 45 at % or less, and further preferably 40 at % or less.

In Configurations (2) and (3), the difference in total contents of chromium and metal elements such as indium between the etching stopper film 3 and etching mask film 5 is preferably 10 at % or more, more preferably 15 at % or more, and further preferably 20 at % or more. Also, the difference in total contents of chromium and metal elements such as indium between the etching stopper film 3 and etching mask film 5 is preferably 45 at % or less, more preferably 40 at % or less, and further preferably 35 at % or less.

The total contents of chromium and metal elements such as indium in the etching stopper film 3 are preferably 70 at % or less, more preferably 60 at % or less, and further preferably 50 at % or less. Also, the total contents of chromium and metal elements such as indium in the etching stopper film 3 are preferably 30 at % or more, more preferably 35 at % or more, and further preferably 40 at % or more. Further, the oxygen content in the etching stopper film 3 is preferably 30 at % or more, more preferably 35 at % or more, and further preferably 40 at % or more. Also, the oxygen content in the etching stopper film 3 is preferably 60 at % or less, more preferably 55 at % or less, and further preferably 50 at % or less.

The total contents of chromium and metal elements such as indium in the etching mask film 5 are preferably 35 at % or more, more preferably 45 at % or more, and further preferably 50 at % or more. Also, the total contents of chromium and metal elements such as indium in the etching mask film 5 are preferably 90 at % or less, more preferably 80 at % or less, and further preferably 70 at % or less. The oxygen content in the etching mask film 5 is preferably 10 at % or more, more preferably 15 at % or more, and further preferably 20 at % or more. Also, the oxygen content in the etching mask film 5 is preferably 50 at % or less, more preferably 40 at % or less, and further preferably 35 at % or less.

There is no particular limitation on the transparent substrate 1, provided that it is transparent to the exposure light wavelength used. In the present invention, a synthetic quartz glass substrate, and various other glass substrates (e.g., soda lime glass, aluminosilicate glass, etc.) may be used. The refinement of a pattern of a semiconductor device requires the refinement of a mask pattern formed in the light semitransmissive film, as well as shortening of a wavelength of an exposure light source used in photolithography in the manufacture of the semiconductor device. Recently, the exposure light sources used in the manufacture of the semiconductor devices are shifting from KrF excimer lasers (wavelength: 248 nm) to ArF excimer lasers (wavelength: 193 nm), that is, shorter wavelength light sources are increasingly used. Since the synthetic quartz glass substrate, among the various glass substrates, has particularly high transparency at a wavelength of the ArF excimer lasers or in a shorter wavelength range, it is suitable as a substrate for the mask blank of the present invention used in forming a high-definition transfer pattern.

The light semitransmissive film 2 is formed from a material which can be dry etched with the etching gas containing the fluorine-based gas. The light semitransmissive film 2 has a function allowing for the transmission of the exposure light at a predetermined transmittance. The light semitransmissive film preferably has a transmittance of 1% or more with respect to the exposure light. The light semitransmissive film 2 is preferably a phase shift film used for a half tone phase shift mask or a light semitransmissive film used for an enhancer phase shift mask.

The light semitransmissive film (phase shift film) 2 for a half tone phase shift mask blank allows the transmission of light at an intensity not substantially contributing to the light exposure (e.g., 1% to 30% with respect to the exposure wavelength), and has a predetermined phase difference (e.g., 150 degrees to 180 degrees). A light semitransmissive portion formed by patterning the light semitransmissive film 2, and a light transmissive portion which allows the transmission of light at an intensity substantially contributing to the light exposure and has no light semitransmissive film formed thereon are provided, such that a phase of light transmitted through the light semitransmissive portion is in a substantially inverted relation with respect to a phase of light transmitted through the light transmissive portion. As a result, the light transmitted through the light semitransmissive portion and the light transmitted through the light transmissive portion pass near a boundary between the light semitransmissive portion and the light transmissive portion, and enter the other's region due to a diffraction phenomenon, thereby annihilating both of them, so that a light intensity at the boundary is nearly zero and a contrast, i.e., a resolution, at the boundary is improved.

The light semitransmissive film 2 of the mask blank for the enhancer phase shift mask also allows the transmission of the light at the intensity not substantially contributing to the light exposure (e.g., 1% to 30% with respect to the exposure wavelength). However, it has a small phase difference caused in the transmitted exposure light (e.g., the phase difference of 30 degrees or less, and preferably 0 degrees), which is different from the light semitransmissive film 2 for the half tone phase shift mask blank.

The light semitransmissive film 2 is preferably made of a material containing silicon and nitrogen. Also, the light semitransmissive film 2 is preferably made of a material containing silicon, transition metal, and nitrogen. In this case, the transition metal includes one or more metals of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), palladium (Pd), etc., or alloys of these metals. In addition to the above elements, elements such as nitrogen (N), oxygen (O), carbon (C), hydrogen (H), and boron (B) may be contained in the material for the light semitransmissive film 2. Also, an inactive gas such as helium (He), argon (Ar), krypton (Kr), and xenon (Xe) may be contained in the material for the light semitransmissive film 2.

These materials have a high etching rate in the dry etching with the etching gas containing the fluorine-based gas, and thus, various properties required for the light semitransmissive film may be easily obtained. Specifically, these materials are desirable as materials forming a phase shift film which should strictly control the phase of the exposure light transmitted through the light semitransmissive film, or the light semitransmissive film for the enhancer phase shift mask which has a laminated structure of a phase delay film and a phase progression film. If the light semitransmissive film 2 is a half tone phase shift film or semitransparent laminated film, a percentage [%] calculated by dividing the content of transition metal (M) in the film [at %] by the total contents of transition metal (M) and silicon (Si) [at %] (hereinafter referred to as a M/M+Si ratio) is preferably 35% or less, more preferably 25% or less, and further preferably 20% or less. The transition metal is an element having a higher extinction coefficient and a higher refractive index than silicon. When a refractive index of a material forming a first film is too high, a phase change amount due to a film thickness variation is increased, and thus, it becomes difficult to control both the phase and transmittance.

A material which can be dry etched with the etching gas containing the fluorine-based gas is used for the light shielding film 4. The material having such a property includes a material containing tantalum, and a material containing transition metal and silicon.

The material containing tantalum preferably includes a tantalum metal simple substance, or a compound containing tantalum and one or more elements selected from oxygen, nitrogen, carbon, and boron. The material containing tantalum further includes an alloy containing tantalum and one or more metals selected from hafnium, zirconium, molybdenum, and the like, or a compound in which one or more elements selected from oxygen, nitrogen, boron, and carbon are added to the alloy.

The material containing transition metal and silicon preferably includes a material comprised of transition metal and silicon, and a compound containing one or more elements selected from oxygen, nitrogen, carbon, and boron in addition to the transition metal and silicon. The suitable transition metal includes one or more metals selected from molybdenum, tantalum, tungsten, titanium, chromium, hafnium, nickel, vanadium, zirconium, ruthenium, rhodium, niobium, palladium, iron, copper, zinc, silver, platinum, and gold.

The light shielding film 4 may be a single layer structure, or a laminated structure having two or more layers. The phase shift mask 200 manufactured from the mask blank 100 comprises the light shielding band pattern formed of a laminated structure of the light semitransmissive pattern 2a, etching stopper pattern 3b, and light shielding pattern 4b. Thus, in the mask blank of the present invention, the laminated structure of the light semitransmissive film 2, etching stopper film 3, and light shielding film 4 desirably has 2.8 or more of optical density (OD) with respect to the exposure light, and 3.0 or more of OD is preferable.

If the light shielding film 4 with the single layer structure is formed using the material containing tantalum, the contents of elements other than tantalum in the film, in particular the contents of oxygen and nitrogen, which easily reduce the optical density, are preferably reduced to the utmost in order to ensure the optical density. On the other hand, this material tends to have low chemical resistance. Thus, if the light shielding film 4 with the single layer structure is formed using the material containing tantalum, its surface layer preferably has a highly-oxidized layer formed thereon. The oxygen content in the highly-oxidized layer is preferably 60 at % or more, more preferably 66.7 at % or more, and further preferably 68 at % or more. It is because a ratio of $Ta_2O_5$ bonding in the highly-oxidized layer becomes higher and the durability such as chemical resistance is enhanced as the oxygen content increases. The crystal structure of the light shielding film 4 is preferably microcrystalline, and more preferably amorphous.

Preferably, the thickness of the highly-oxidized layer is not less than 1.5 nm and not more than 4 nm in order to achieve the above working-effect sufficiently. If the thickness of the highly-oxidized layer is less than 1.5 nm, the above effect cannot be achieved sufficiently, and the thickness greater than 4 nm has a profound effect on an optical property of the light shielding film 4. In view of the balance among the securement of optical density, the chemical resistance, and the improvement of durability in the dry etching with a mixed gas of oxygen and chlorine throughout the light shielding film 4, the thickness of the highly-oxidized layer is more preferably not less than 1.5 nm and not more than 3 nm.

The light shielding film 4 may be made of the material containing tantalum, and includes a structure in which the lower layer 41 and upper layer 42 are laminated in said order, and the upper layer 42 may be formed from a material containing tantalum and oxygen. In the lower layer 41, the contents of elements other than tantalum in the film, in particular the contents of oxygen and nitrogen, which easily reduce the optical density, are preferably reduced to the utmost in order to ensure the optical density. The upper layer 42 should contain oxygen or nitrogen to reduce surface reflection so as to increase a refractive index and decrease an extinction coefficient in the upper layer 42. However, in order to ensure that the optical density is as high as possible in the upper layer 42, the oxygen content which significantly reduces the extinction coefficient k is preferably less than 60 at %. The surface layer of the upper layer 42 preferably has a highly-oxidized layer formed thereon with the oxygen content of 60 at % or more. The other details of the highly-oxidized layer formed on the surface layer are similar to those of the highly-oxidized layer formed in the light shielding film 4 with the single layer structure for which the material containing tantalum is used.

The material containing tantalum and nitrogen is preferably used for the light shielding film 4 with the single layer structure or the lower layer 41 of the light shielding film 4 with the laminated structure. In these cases, when the nitrogen content is less than 62 at % (preferably 51 at % or less, and more preferably 30 at % or less), surface roughness expressed with Rq may be suppressed to 0.60 nm or less.

When the light shielding film 4 with the single layer structure is formed using a material containing transition metal and silicon, the contents of elements other than transition metal and silicon in the film, in particular the contents of oxygen and nitrogen, which easily reduce the optical density, are preferably reduced to the utmost in order to ensure the optical density. On the other hand, this material tends to have low chemical resistance. Further, this material does not have sufficiently high durability to the dry etching with a mixed gas of a chlorine-based gas and an oxygen gas used for removing the etching mask film 5 laminated on a surface of the light shielding film 4. The above chemical resistance and etching durability tend to lower as the transition metal content in the film increases. Also, the chemical resistance and etching durability tend to get higher as the oxygen content in the film increases. In view of these aspects, when the light shielding film 4 with the single layer structure is formed using the material containing transition metal and silicon described above, an oxidized layer having the transition metal content of 4 at % or less and the oxygen content of 30 at % or more is preferably provided on the surface layer of the light shielding film 4.

The light shielding film 4 may be made of the material containing transition metal and silicon described above, and may include the laminated structure of the lower layer 41 and upper layer 42, and the upper layer 42 may be formed from a material containing transition metal, silicon, and nitrogen. In the lower layer 41, the contents of elements other than transition metal and silicon in the film, in particular the contents of oxygen and nitrogen, which easily reduce the optical density, are preferably reduced to the utmost in order to ensure the optical density. The upper layer 42 should contain oxygen or nitrogen to reduce surface reflection so as to increase the refractive index and decrease the extinction coefficient in the upper layer 42. However, in order to ensure that the optical density is as high as possible in the upper layer 42, the oxygen content which significantly reduces the extinction coefficient k is preferably reduced. Preferably, the surface layer of the upper layer 42 has an oxidized layer provided thereon with the transition metal content of 4 at % or less and the oxygen content of 30 at % or more.

If the light shielding film 4 with the single layer structure or the lower layer 41 is formed using the material containing transition metal and silicon, a percentage [%] calculated by dividing the content of transition metal (M) in the material [at %] by the total contents of transition metal (M) and silicon (Si) [at %] (hereinafter referred to as a M/M+Si ratio) is preferably not less than 9% and not more than 35%, and more preferably not less than 11% and not more than 33%. When the material containing transition metal and silicon falls within these ranges of M/M+Si ratio, the optical density of the material may become higher.

The thickness of the upper layer 42 is preferably 3 nm or more, more preferably 5 nm or more, and further preferably 7 nm or more. Also, the thickness of the upper layer 42 is preferably 20 nm or less, more preferably 15 nm or less, and further preferably 10 nm or less.

The ratio of the upper layer 42 to the whole thickness of the light shielding film 4 is preferably 1/10 or more, more preferably 1/5 or more, and further preferably 1/4 or more. Also, the ratio of the upper layer 42 to the whole thickness of the light shielding film 4 is preferably 2/3 or less, more preferably 1/2 or less, and further preferably 1/3 or less.

While a method for forming the light semitransmissive film 2, etching stopper film 3, light shielding film 4, and etching mask film 5 on the transparent substrate 1 preferably includes, for example, a sputtering deposition method, it is not necessarily limited to the sputtering deposition method in the present invention.

The embodiments of the present invention also provide a transfer mask in which a light semitransmissive pattern is formed in the light semitransmissive film of the mask blank according to the above embodiments and light shielding band patterns are formed in the etching mask film and light shielding film, as well as a method for manufacturing the transfer mask. FIGS. 3(A), 3(B), 3(C), 3(D), 3(E), 3(F), 3(G) are cross-sectional views showing a manufacturing process of the transfer mask according to the first embodiment of the present invention. The method for manufacturing the transfer mask according to this embodiment is described below in accordance with the manufacturing process shown in FIGS. 3(A), 3(B), 3(C), 3(D), 3(E), 3(F), 3(G). The configuration of the mask blank 100 used here is as stated above.

First, a first resist film made of an organic material is formed adjacent to a surface of the etching mask film 5 of the mask blank 100. Next, a first pattern including a desired light semitransmissive pattern (transfer pattern) and an alignment mark pattern to be formed in the light semitransmissive film 2 is drawn on the first resist film, and a development process is conducted, such that a resist film (first resist pattern) 6a having the desired light semitransmissive pattern and alignment mark pattern is formed (FIG. 3(A)).

Figure 3E:
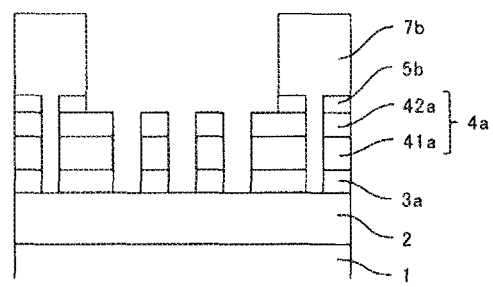
Figure 3B:
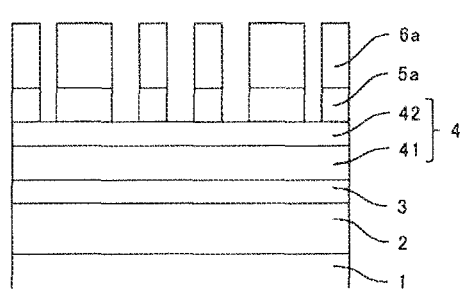
Figure 3F:
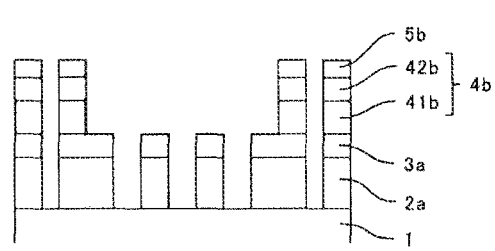

Then, the dry etching with the oxygen-containing chlorine-based gas (mixed gas of the chlorine-based gas and oxygen gas) using the first resist pattern 6a as a mask is performed on the etching mask film 5, such that the etching mask film (etching mask pattern) 5a having the first pattern is formed (FIG. 3(B)). After that, the first resist pattern 6a is removed. The chlorine-based gas in the oxygen-containing chlorine-based gas used for the dry etching of the etching mask film 5 includes, for example, $Cl_2$, $SiCl_4$, $CHCl_3$, $CH_2Cl_2$, $CCl_4$, $BCl_3$, etc. The same goes for the oxygen-containing chlorine-based gas used for the dry etching of the etching stopper film 3 described below.

Figure 3C:
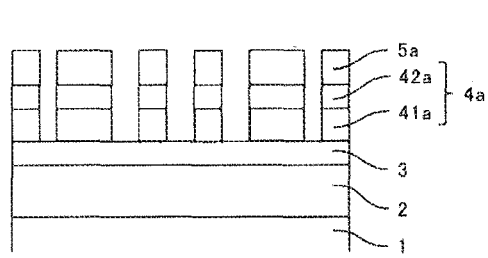
Figure 3G:
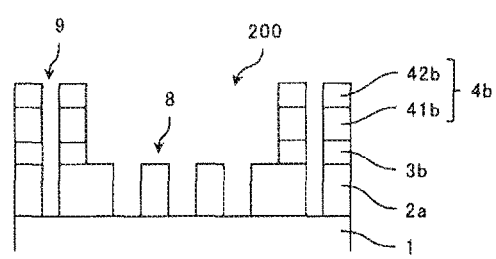

Next, the dry etching with the fluorine-based gas using as a mask the etching mask film (etching mask pattern) 5a having the first pattern is performed on the light shielding film 4 (upper layer 42 and lower layer 41), so as to form the light shielding film (light shielding pattern) 4a having the first pattern, i.e., an upper layer pattern 42a and a lower layer pattern 41a (FIG. 3(C)). The fluorine-based gas used in this dry etching includes the etching gas such as $SF_6$, $CHF_3$, $CF_4$, $C_2F_6$ and $C_4F_8$. The fluorine-based gas in the present invention also includes a mixed gas of a fluorine-containing gas as cited above and a gas such as helium or oxygen. If the light shielding film subject to the dry etching is made of the material containing tantalum, the use of the fluorine-based gas containing carbon is preferable because it can make the etching rate higher. On the other hand, if the light shielding film subject to the dry etching is made of the material containing transition metal and silicon, the use of the fluorine-based gas ($SF_6$) free from carbon is preferable because it can make the etching rate higher. The fluorine-based gas ($SF_6$) free from carbon is suitable as the etching gas for etching the light semitransmissive film 2 because of relatively high etch selectivity between the light semitransmissive film 2 and transparent substrate 1.

Then, the dry etching with the oxygen-containing chlorine-based gas (mixed gas of the chlorine-based gas and oxygen gas) using as a mask the light shielding film (light shielding pattern) 4a having the first pattern is performed on the etching stopper film 3, so as to form the etching stopper film (etching stopper pattern) 3a having the first pattern. At this point, the etching mask pattern 5a is also etched with the oxygen-containing chlorine-based gas. However, since the etching mask film and etching stopper film are formed so as to have the above relationship, the etching mask pattern 5a may remain even after the dry etching of the etching stopper pattern 3a is completed (FIG. 3(D)).

Then, a second resist film made of an organic material is formed adjacent to a surface of the etching mask pattern 5a. A second pattern including a desired light shielding band pattern to be formed in each of the light shielding film 4 and etching stopper film 3 is drawn on the second resist film, and a development process is conducted, such that a resist film (second resist pattern) 7b having the second pattern including the desired light shielding band pattern is formed. Then, the dry etching with the oxygen-containing chlorine-based gas using the second resist pattern 7b as a mask is performed on the etching mask film 5a, so as to form the etching mask film (etching mask pattern) 5b having the second pattern (FIG. 3(E)). The etching mask pattern 5b after this step comprises both the second pattern including the light shielding band pattern and the alignment mark pattern. After that, the second resist pattern 7b was removed.

Next, the dry etching with the fluorine-based gas using as a mask the etching stopper film (etching stopper pattern) 3a having the first pattern is performed, so as to form the light semitransmissive film (light semitransmissive pattern) 2a having the first pattern. At the same time, the dry etching with the fluorine-based gas using as a mask the etching mask film (etching mask pattern) 5b having the second pattern and alignment mark pattern is also performed, so as to form the light shielding film (light shielding pattern) 4b having the second pattern, i.e., the upper layer pattern 42b and lower layer pattern 41b (FIG. 3(F)). At this time, the alignment pattern is formed in the light semitransmissive film 2, and the surface of the transparent substrate is exposed. The light shielding pattern 4b (upper layer pattern 42b and lower layer pattern 41b) after this step comprises both the second pattern including the light shielding band pattern and the alignment mark pattern.

Then, the dry etching with the oxygen-containing chlorine-based gas (mixed gas of the chlorine-based gas and oxygen gas) using the light shielding pattern 4b as a mask is performed on the etching stopper pattern 3a, and the etching stopper film in the region where the light shielding film is not left is removed, such that the etching stopper film (etching stopper pattern) 3b having the second pattern is formed. At the same time, the etching mask film (etching mask pattern) 5b having the second pattern is removed as a whole by the dry etching with the oxygen-containing chlorine-based gas. The etching stopper pattern 3b after this step comprises both the second pattern including the light shielding band pattern and the alignment mark pattern. After that, the predetermined cleaning is conducted, such that the transfer mask 200 is obtained (FIG. 3(G)).

This transfer mask 200 comprises the alignment mark 9 formed from the portion where the transparent substrate 1 is exposed and the laminated structure of the light semitransmissive pattern 2a, etching stopper pattern 3b, and light shielding pattern 4b. The alignment mark 9 has a contrast with respect to detection light from an alignment mark detector, which is significantly higher than the alignment mark formed between the light semitransmissive pattern and the transparent substrate.

In the transfer mask of the present invention, for example, if the transparent substrate is a quadrangle with a side length of about 152 mm, a transfer pattern forming region where the transfer pattern is formed is an inner region of a quadrangle with a size of 132 mm×104 mm based on the center of the transparent substrate. The alignment mark is fundamentally formed in a region outside the transfer pattern forming region. While the alignment mark formed between the transparent substrate 1 and the pattern of the laminated structure of the light semitransmissive film 2, etching stopper film 3, and light shielding film 4 is described above, the alignment mark is not limited thereto. Marks formed between the transparent substrate 1 and the pattern of the laminated structure of the light semitransmissive film 2, etching stopper film 3, and light shielding film 4 in the region outside the transfer pattern forming region of the transfer mask include individual identification marks such as bar-codes or marks such as characters for visual identification. These marks also preferably have high contrasts, and thus, it is preferable that the configuration of the mask blank or transfer mask of the present invention is applied to these marks.

EXAMPLES

The embodiments of the present invention are specifically described below based on Examples.

Example 1

A transparent substrate 1 having a main surface dimension of about 152 mm×about 152 mm and a thickness of about 6.35 mm and made of synthetic quartz glass was prepared. End faces and the main surface of the transparent substrate 1 were polished to have predetermined surface roughness, and then, the transparent substrate 1 was subjected to predetermined cleaning and drying processes.

Then, the transparent substrate 1 was placed in a single-wafer DC sputtering device, a mixed target of molybdenum (Mo) and silicon (Si) (Mo:Si=12 at %:88 at %) was used, and reactive sputtering (DC sputtering) in a mixed gas atmosphere of argon (Ar), nitrogen ($N_2$), and helium (He) was performed, such that the light semitransmissive film 2 made of molybdenum, silicon, and nitrogen (MoSiN film; Mo: 12 at %, Si: 39 at %, N: 49 at %), having a film thickness of 69 nm, was formed on the substrate 1. The composition of the MoSiN film was obtained as a result from Auger electron spectroscopy (AES). The same goes for the other films below.

Then, on the transparent substrate 1 with the MoSiN film (light semitransmissive film 2) formed thereon, a process for forming an oxidized layer on the surface layer of the light semitransmissive film 2 was conducted. In particular, a heating furnace (electric furnace) was used to conduct a heating process at a heating temperature of 450 degrees C. in the air for one hour. The light semitransmissive film 2 after the heating process was analyzed by Auger electron spectroscopy (AES). As a result, it was found that the oxidized layer having a thickness of about 1.5 nm measured from the surface of the light semitransmissive film 2 was formed and had the oxygen content of 42 at %. For the MoSiN film (light semitransmissive film 2) after the heating process, the transmittance and phase difference at a wavelength of light of the ArF excimer laser (about 193 nm) were measured by a phase shift amount measuring device. As a result, the transmittance was 6.07%, and the phase difference was 177.3 degrees.

Then, the transparent substrate 1 was placed in the single-wafer DC sputtering device, a chromium (Cr) target was used, and the reactive sputtering (DC sputtering) in the mixed gas atmosphere of argon (Ar), nitrogen ($N_2$), carbon dioxide ($CO_2$), and helium (He) was conducted, such that the etching stopper film 3 made of chromium, oxygen, carbon, and nitrogen (CrOCN film; Cr: 48.9 at %, O: 26.4 at %, C: 10.6 at %, N: 14.1 at %), having a film thickness of 5 nm, was formed adjacent to the surface of the light semitransmissive film 2.

Next, the transparent substrate 1 was placed in the single-wafer DC sputtering device, a tantalum (Ta) target was used, and the sputtering (DC sputtering) in a nitrogen ($N_2$) and xenon (Xe) gas atmosphere was conducted, such that the lower layer 41 of the light shielding film 4, made of tantalum and nitrogen (TaN film; Ta: 88.7 at %, N: 11.3 at %) and having a film thickness of 20 nm, was formed adjacent to the surface of the etching stopper film 3. Subsequently, the sputtering (DC sputtering) in an oxygen ($O_2$) and argon (Ar) gas atmosphere was conducted, such that the upper layer 42 of the light shielding film 4, made of tantalum and oxygen (TaO film; Ta: 41.1 at %, O: 58.9 at %) and having a film thickness of 6 nm, was formed. As a result, the tantalum-based light shielding film 4 having a total thickness of 26 nm was formed.

Next, the transparent substrate 1 was placed in the single-wafer DC sputtering device, the chromium (Cr) target was used, and the reactive sputtering (DC sputtering) in a mixed gas atmosphere of argon (Ar), nitrogen ($N_2$), carbon dioxide ($CO_2$), and helium (He) was conducted, such that the etching mask film 5 made of chromium, oxygen, carbon, and nitrogen (CrOCN film; Cr: 48.9 at %, O: 26.4 at %, C: 10.6 at %, N: 14.1 at %), having a film thickness of 15 nm, was formed adjacent to the surface of the light shielding film 4 (upper layer 42). The predetermined cleaning process was further conducted, such that the mask blank 100 of Example 1 was obtained.

[Manufacture of the Transfer Mask]

Then, the mask blank 100 of Example 1 was used to fabricate the transfer mask 200 of Example 1 through the following procedure. First, the first resist film having a film thickness of 80 nm and made of a chemically amplified resist for electron beam drawing was formed adjacent to the surface of the etching mask film 5 through a spin coating method. Then, the first pattern was drawn with an electron beam on the first resist film, and the predetermined development and cleaning processes were conducted, such that the first resist film (first resist pattern) 6a having the first pattern was formed (FIG. 3(A)). The first pattern included, in the transfer pattern forming region (inner region of 132 mm×104 mm), a transfer pattern of DRAM hp32 nm generation (a fine pattern including SRAF with a line width of 40 nm) to be formed in the light semitransmissive film 2, and further included the alignment mark pattern arranged in the region outside the transfer pattern forming region, where the light shielding band is formed (region where the light shielding film 4 is left upon the completion of the transfer mask 200).

Next, the dry etching with a mixed gas of chlorine and oxygen (gas flow ratio of $Cl_2:O_2=4:1$) using the first resist pattern 6a as a mask was performed on the etching mask film 5, such that the etching mask film (etching mask pattern) 5a having the first pattern was formed (FIG. 3(B)). After that, the first resist pattern 6a was removed.

Next, the dry etching with the fluorine-based gas ($CF_4$) using the etching mask pattern 5a as a mask was performed on the upper layer 42 and lower layer 41 of the light shielding film 4, so as to form the light shielding film (light shielding pattern) 4a having the first pattern, i.e., the upper layer pattern 42a and lower layer pattern 41a (FIG. 3(C)).

Figure 3D:
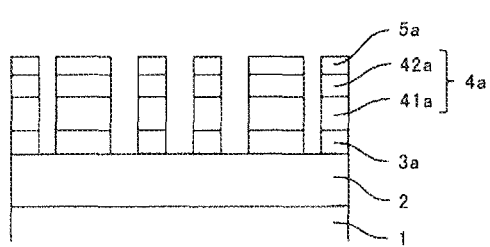

Next, the dry etching with the mixed gas of chlorine and oxygen (gas flow ratio of $Cl_2:O_2=4:1$) using the light shielding pattern 4a as a mask was performed, such that the etching stopper film (etching stopper pattern) 3a having the first pattern was formed (FIG. 3(D)). At this time, while the etching mask pattern 5a was also etched from its surface with the mixed gas of chlorine and oxygen, it remained with the thickness of about 5 nm.

Then, the second resist film having the film thickness of 80 nm and made of the chemically amplified resist for electron beam drawing was formed adjacent to the surface of the etching mask pattern 5a through the spin coating method. Subsequently, the second pattern was drawn with the electron beam on the second resist film, and the predetermined development and cleaning processes were conducted, such that the second resist film (second resist pattern) 7b having the second pattern was formed. The second pattern comprises the light shielding band pattern arranged in the region outside the transfer pattern forming region.

Next, the dry etching with the mixed gas of chlorine and oxygen (gas flow ratio of $Cl_2:O_2=4:1$) using the second resist pattern 7b as a mask was performed, such that the etching mask film (etching mask pattern) 5b having the second pattern and alignment mark pattern was formed (FIG. 3(E)). After that, the second resist pattern 7b was removed.

Then, the dry etching with the etching gas containing the fluorine-based gas ($SF_6$+He) using the etching stopper pattern 3a as a mask was performed, such that the light semitransmissive film (light semitransmissive pattern) 2a having the first pattern was formed. Further, at the same time, the etching mask pattern 5b was used as a mask, so as to form the light shielding film (light shielding pattern) 4b having the second pattern and alignment mark pattern, i.e., the upper layer pattern 42b and lower layer pattern 41b (FIG. 3(F)).

Next, the dry etching with the mixed gas of chlorine and oxygen (gas flow ratio of $Cl_2$:$O_2$=4:1) using the light shielding pattern 4b as a mask was performed, such that the etching stopper film (etching stopper pattern) 3b having the second pattern and alignment mark pattern was formed. At the same time, the etching mask pattern 5b was removed as a whole by this dry etching. After that, the predetermined cleaning was conducted, such that the transfer mask (phase shift mask) 200 was obtained (FIG. 3(G)).

[Evaluation of the Pattern Transfer Performance]

Using AIMS193 (manufactured by Carl Zeiss), a simulation of a transfer image in the exposure transfer to the resist film on a semiconductor device with the exposure light at the wavelength of 193 nm was performed on the fabricated transfer mask 200 of Example 1. As a result of inspection of the transfer image exposed in this simulation, there was no short or disconnection in patterns, which satisfied the design specification sufficiently. From this result, a circuit pattern finally formed on the semiconductor device may have great accuracy, even if the transfer mask 200 of Example 1 is set on a mask stage of the exposure apparatus to perform the exposure transfer to the resist film on the semiconductor device. Also, as for the contrast of the alignment mark, there is no misregistration between the light semitransmissive pattern 2a, etching stopper pattern 3b, and light shielding pattern 4b, and a high contrast with respect to the detection light from the alignment mark detector was obtained.

Example 2

The light semitransmissive film 2 and etching stopper film 3 were formed in said order on the transparent substrate 1 by a procedure similar to Example 1. Next, the transparent substrate 1 was placed in the single-wafer DC sputtering device, a mixed target of molybdenum (Mo) and silicon (Si) (Mo:Si=13 at %:87 at %) was used, and the sputtering (DC sputtering) in the nitrogen ($N_2$) and argon (Ar) gas atmosphere was conducted, such that the lower layer 41 of the light shielding film 4, made of molybdenum, silicon, and nitrogen (MoSiN film; Mo: 9.2 at %, Si: 68.3 at %, N: 22.5 at %) and having a film thickness of 35 nm, was formed adjacent to the surface of the etching stopper film 3. Then, the sputtering (DC sputtering) in the nitrogen ($N_2$) and argon (Ar) gas atmosphere was conducted, the upper layer 42 of the light shielding film 4, made of molybdenum, silicon, and nitrogen (MoSiN film; Mo: 5.8 at %, Si: 64.4 at %, N: 27.7 at %) and having a film thickness of 4 nm, was formed. Thus, the MoSi-based light shielding film 4 having a total thickness of 39 nm was formed.

Next, the transparent substrate 1 was placed in the single-wafer DC sputtering device, the chromium (Cr) target was used, and the reactive sputtering (DC sputtering) in a mixed gas atmosphere of argon (Ar) and nitrogen ($N_2$) was conducted, such that the etching mask film 5 made of chromium and nitrogen (CrN film; Cr: 81 at %, N: 19 at %), having a film thickness of 10 nm, was formed adjacent to the surface of the light shielding film 4 (upper layer 42). The predetermined cleaning process was further conducted, such that the mask blank 100 of Example 2 was obtained.

[Manufacture of the Transfer Mask]

Then, the mask blank 100 of Example 2 was used to fabricate the transfer mask 200 of Example 2 through a procedure similar to Example 1. However, in the dry etching with the fluorine-based gas using the etching mask pattern 5a as a mask performed on the upper layer 42 and lower layer 41 of the light shielding film 4, a mixed gas of $SF_6$ and He was used as the fluorine-based gas. In the step of performing the dry etching with the mixed gas of chlorine and oxygen (gas flow ratio of $Cl_2$:$O_2$=4:1) using the light shielding pattern 4a as a mask to form the etching stopper film (etching stopper pattern) 3a having the first pattern, while the etching mask pattern 5a was also etched from its surface with the mixed gas of chlorine and oxygen at the same time, it remained with the thickness of about 6 nm.

[Evaluation of the Pattern Transfer Performance]

Using AIMS193 (manufactured by Carl Zeiss), a simulation of the transfer image in the exposure transfer to the resist film on the semiconductor device with the exposure light at the wavelength of 193 nm was performed on the fabricated transfer mask 200 of Example 2. As a result of inspection of the transfer image exposed in this simulation, there was no short or disconnection in patterns, which satisfied the design specification sufficiently. From this result, the circuit pattern finally formed on the semiconductor device may have great accuracy, even if the transfer mask 200 of Example 2 is set on the mask stage of the exposure apparatus to perform the exposure transfer to the resist film on the semiconductor device. Also, as for the contrast of the alignment mark, there is no misregistration between the light semitransmissive pattern 2a, etching stopper pattern 3b, and light shielding pattern 4b, and a high contrast with respect to the detection light from the alignment mark detector was obtained.

Example 3

The light semitransmissive film 2 was formed on the transparent substrate 1 by a procedure similar to Example 2. Next, the transparent substrate 1 was placed in the single-wafer DC sputtering device, the chromium (Cr) target was used, and the reactive sputtering (DC sputtering) in the mixed gas atmosphere of argon (Ar), nitrogen ($N_2$), carbon dioxide ($CO_2$), and helium (He) was conducted, such that the etching stopper film 3 made of chromium, oxygen, carbon, and nitrogen (CrOCN film; Cr: 48.9 at %, O: 26.4 at %, C: 10.6 at %, N: 14.1 at %), having a film thickness of 5 nm, was formed adjacent to the surface of the light semitransmissive film 2.

Then, the MoSi-based light shielding film 4 was formed by a procedure similar to Example 2. Subsequently, the transparent substrate 1 was placed in the single-wafer DC sputtering device, a mixed target of chromium (Cr) and indium (In) (Cr:In=90 at %:10 at %) used, and the reactive sputtering (DC sputtering) in the mixed gas atmosphere of argon (Ar) and nitrogen ($N_2$) was conducted, such that etching mask film 5 made of chromium, indium, and nitrogen (CrInN film; Cr: 67.7 at %, In: 8.1 at %, N: 24.2 at %), having a film thickness of 8 nm, was formed adjacent to the surface of the light shielding film 4 (upper layer 42). The predetermined cleaning process was further conducted, such that the mask blank 100 of Example 3 was obtained.

[Manufacture of the Transfer Mask]

Then, the mask blank 100 of Example 3 was used to fabricate the transfer mask 200 of Example 3 through a procedure similar to Example 2. In the dry etching with the mixed gas of chlorine and oxygen (gas flow ratio of $Cl_2$:$O_2$=4:1) using the light shielding pattern 4a as a mask to form the etching stopper film (etching stopper pattern) 3a having the first pattern, while the etching mask pattern 5a was also etched from its surface with the mixed gas of chlorine and oxygen at the same time, it remained with the thickness of about 3 nm.

[Evaluation of the Pattern Transfer Performance]

Using AIMS193 (manufactured by Carl Zeiss), a simulation of the transfer image in the exposure transfer to the resist film on the semiconductor device with the exposure light at the wavelength of 193 nm was performed on the fabricated transfer mask 200 of Example 3. As a result of inspection of the transfer image exposed in this simulation, there was no short or disconnection in patterns, which satisfied the design specification sufficiently. From this result, the circuit pattern finally formed on the semiconductor device may have great accuracy, even if the transfer mask 200 of Example 3 is set on the mask stage of the exposure apparatus to perform the exposure transfer to the resist film on the semiconductor device. Also, as for the contrast of the alignment mark, there is no misregistration between the light semitransmissive pattern 2a, etching stopper pattern 3b, and light shielding pattern 4b, and a high contrast with respect to the detection light from the alignment mark detector was obtained.

Example 4

The light semitransmissive film 2 was formed on the transparent substrate 1 by a procedure similar to Example 2. Next, the transparent substrate 1 was placed in the single-wafer DC sputtering device, the mixed target of chromium (Cr) and indium (In) (Cr:In=87 at %:13 at %) was used, and the reactive sputtering (DC sputtering) in the mixed gas atmosphere of argon (Ar) and nitrogen ($N_2$) was conducted, such that the etching stopper film 3 made of chromium, indium, and nitrogen (CrInN film; Cr: 73.1 at %, In: 10.6 at %, N: 16.3 at %), having a film thickness of 4 nm, was formed adjacent to the surface of the light semitransmissive film 2.

Then, the MoSi-based light shielding film 4 was formed by a procedure similar to Example 2. Subsequently, the transparent substrate 1 was placed in the single-wafer DC sputtering device, the chromium (Cr) target was used, and the reactive sputtering (DC sputtering) in the mixed gas atmosphere of argon (Ar), nitrogen ($N_2$), carbon dioxide ($CO_2$), and helium (He) was conducted, such that the etching mask film 5 made of chromium, oxygen, carbon, and nitrogen (CrOCN film; Cr: 39.1 at %, O: 26.4 at %, C: 10.6 at %, N: 23.9 at %), having a film thickness of 12 nm, was formed adjacent to the surface of the light semitransmissive film 2. The predetermined cleaning process was further conducted, such that the mask blank 100 of Example 4 was obtained.

[Manufacture of the Transfer Mask]

Then, the mask blank 100 of Example 4 was used to fabricate the transfer mask 200 of Example 4 through a procedure similar to Example 2. In the dry etching with the mixed gas of chlorine and oxygen (gas flow ratio of $Cl_2$: $O_2$=4:1) using the light shielding pattern 4a as a mask to form the etching stopper film (etching stopper pattern) 3a having the first pattern, while the etching mask pattern 5a was also etched from its surface with the mixed gas of chlorine and oxygen at the same time, it remained with the thickness of about 5 nm.

[Evaluation of the Pattern Transfer Performance]

Using AIMS193 (manufactured by Carl Zeiss), a simulation of the transfer image in the exposure transfer to the resist film on the semiconductor device with the exposure light at the wavelength of 193 nm was performed on the fabricated transfer mask 200 of Example 4. As a result of inspection of the transfer image exposed in this simulation, there was no short or disconnection in patterns, which satisfied the design specification sufficiently. From this result, the circuit pattern finally formed on the semiconductor device may have great accuracy, even if the transfer mask 200 of Example 4 is set on the mask stage of the exposure apparatus to perform the exposure transfer to the resist film on the semiconductor device. Also, as for the contrast of the alignment mark, there is no misregistration between the light semitransmissive pattern 2a, etching stopper pattern 3b, and light shielding pattern 4b, and a high contrast with respect to the detection light from the alignment mark detector was obtained.

Example 5

The light semitransmissive film 2 was formed on the transparent substrate 1 by a procedure similar to Example 2. Next, the transparent substrate 1 was placed in the single-wafer DC sputtering device, the chromium (Cr) target was used, and the reactive sputtering (DC sputtering) in the mixed gas atmosphere of argon (Ar) and nitrogen ($N_2$) was conducted, such that the etching stopper film 3 made of chromium and nitrogen (CrN film; Cr: 72 at %, N: 28 at %), having a film thickness of 3 nm, was formed adjacent to the surface of the light semitransmissive film 2.

Then, the MoSi-based light shielding film 4 was formed by a procedure similar to Example 2. Subsequently, the transparent substrate 1 was placed in the single-wafer DC sputtering device, the mixed target of chromium (Cr) and indium (In) (Cr:In=85 at %:15 at %) was used, and the reactive sputtering (DC sputtering) in the mixed gas atmosphere of argon (Ar), nitrogen ($N_2$), carbon dioxide ($CO_2$), and helium (He) was conducted, such that the etching mask film 5 made of chromium, indium, oxygen, carbon, and nitrogen (CrInOCN film; Cr: 42.2 at %, In: 6.9 at %, O: 9.4 at %, C: 17.8 at %, N: 23.7 at %), having a film thickness of 12 nm, was formed adjacent to the surface of the light shielding film 4 (upper layer 42). The predetermined cleaning process was further conducted, such that the mask blank 100 of Example 5 was obtained.

[Manufacture of the Transfer Mask]

Then, the mask blank 100 of Example 5 was used to fabricate the transfer mask 200 of Example 5 through a procedure similar to Example 2. In the dry etching with the mixed gas of chlorine and oxygen (gas flow ratio of $Cl_2$: $O_2$=4:1) using the light shielding pattern 4a as a mask to form the etching stopper film (etching stopper pattern) 3a having the first pattern, while the etching mask pattern 5a was also etched from its surface with the mixed gas of chlorine and oxygen at the same time, it remained with the thickness of about 5 nm.

[Evaluation of the Pattern Transfer Performance]

Using AIMS193 (manufactured by Carl Zeiss), a simulation of the transfer image in the exposure transfer to the resist film on the semiconductor device with the exposure light at the wavelength of 193 nm was performed on the fabricated transfer mask 200 of Example 5. As a result of inspection of the transfer image exposed in this simulation, there was no short or disconnection in patterns, which satisfied the design specification sufficiently. From this result, the circuit pattern finally formed on the semiconductor device may have great accuracy, even if the transfer mask 200 of Example 5 is set on the mask stage of the exposure apparatus to perform the exposure transfer to the resist film on the semiconductor device. Also, as for the contrast of the alignment mark, there is no misregistration between the light semitransmissive pattern 2a, etching stopper pattern 3b, and light shielding pattern 4b, and a high contrast with respect to the detection light from the alignment mark detector was obtained.

Example 6

The light semitransmissive film 2 was formed on the transparent substrate 1 by a procedure similar to Example 2. Next, the transparent substrate 1 was placed in the single-wafer DC sputtering device, the mixed target of chromium (Cr) and indium (In) (Cr:In=87 at %:13 at %) was used, and the reactive sputtering (DC sputtering) in the mixed gas atmosphere of argon (Ar), nitrogen ($N_2$), carbon dioxide ($CO_2$), and helium (He) was conducted, such that the etching mask film 5 made of chromium, indium, oxygen, carbon, and nitrogen (CrInOCN film; Cr: 41.5 at %, In: 5.8 at %, O: 8.1 at %, C: 17.2 at %, N: 27.4 at %), having a film thickness of 5 nm, was formed adjacent to the surface of the light semitransmissive film 2.

Then, the MoSi-based light shielding film 4 was formed by a procedure similar to Example 2. Subsequently, the mixed target of chromium (Cr) and indium (In) (Cr:In=94 at %:6 at %) was used, and the reactive sputtering (DC sputtering) in the mixed gas atmosphere of argon (Ar) and nitrogen ($N_2$) was conducted, such that etching mask film 5 made of chromium, indium, and nitrogen (CrInN film; Cr: 70.1 at %, In: 3.7 at %, N: 26.2 at %), having a film thickness of 8 nm, was formed adjacent to the surface of the light shielding film 4 (upper layer 42). The predetermined cleaning process was further conducted, such that the mask blank 100 of Example 6 was obtained.

[Manufacture of the Transfer Mask]

Then, the mask blank 100 of Example 6 was used to fabricate the transfer mask 200 of Example 6 through a procedure similar to Example 2. In the dry etching with the mixed gas of chlorine and oxygen (gas flow ratio of $Cl_2$:$O_2$=4:1) using the light shielding pattern 4a as a mask to form the etching stopper film (etching stopper pattern) 3a having the first pattern, while the etching mask pattern 5a was also etched from its surface with the mixed gas of chlorine and oxygen at the same time, it remained with the thickness of about 5 nm.

[Evaluation of the Pattern Transfer Performance]

Using AIMS193 (manufactured by Carl Zeiss), a simulation of the transfer image in the exposure transfer to the resist film on the semiconductor device with the exposure light at the wavelength of 193 nm was performed on the fabricated transfer mask 200 of Example 6. As a result of inspection of the transfer image exposed in this simulation, there was no short or disconnection in patterns, which satisfied the design specification sufficiently. From this result, the circuit pattern finally formed on the semiconductor device may have great accuracy, even if the transfer mask 200 of Example 6 is set on the mask stage of the exposure apparatus to perform the exposure transfer to the resist film on the semiconductor device. Also, as for the contrast of the alignment mark, there is no misregistration between the light semitransmissive pattern 2a, etching stopper pattern 3b, and light shielding pattern 4b, and a high contrast with respect to the detection light from the alignment mark detector was obtained.

REFERENCE NUMERALS

1: transparent substrate
2: light semitransmissive film
2a: light semitransmissive film having the first pattern
3: etching stopper film
3a: etching stopper film having the first pattern
3b: etching stopper film having the second pattern and alignment mark pattern
4: light shielding film
41: lower layer
42: upper layer
4a: light shielding film having the first pattern
4b: light shielding film having the second pattern and alignment mark pattern
5: etching mask film
6a: first resist pattern (resist film having the first pattern)
7b: second resist pattern (resist film having the second pattern)
100: mask blank
200: transfer mask

What is claimed is:

1. A mask blank having a structure in which a light semitransmissive film, an etching stopper film, a light shielding film, and an etching mask film are laminated in said order on a transparent substrate,
    wherein the light semitransmissive film is made of a material containing silicon and nitrogen,
    wherein the light shielding film is made of at least one of a material containing tantalum and a material containing transition metal and silicon,
    wherein the etching mask film and the etching stopper film are made of a material containing chromium,
    wherein a chromium content in the etching mask film is greater than a chromium content in the etching stopper film,
    wherein an oxygen content in the etching mask film is less than an oxygen content in the etching stopper film, and
    wherein the etching mask film has a thickness greater than a thickness of the etching stopper film.

2. The mask blank according to claim 1, wherein the thickness of the etching stopper film is 3 nm or more.

3. The mask blank according to claim 1, wherein the thickness of the etching mask film is 20 nm or less.

4. The mask blank according to claim 1, wherein the chromium content in the etching stopper film is 30 atom % or more.

5. The mask blank according to claim 1, wherein the chromium content in the etching mask film is 90 atom % or less.

6. The mask blank according to claim 1, wherein the oxygen content in the etching stopper film is 60 atom % or less.

7. The mask blank according to claim 1, wherein the oxygen content in the etching mask film is 10 atom % or more.

8. The mask blank according to claim 1, wherein the difference in the chromium content between the etching mask film and the etching stopper film is 5 atom % or more.

9. The mask blank according to claim 1, wherein the difference in the chromium content between the etching mask film and the etching stopper film is 50 atom % or less.

10. The mask blank according to claim 1, wherein the difference in the oxygen content between the etching mask film and the etching stopper film is 5 atom % or more.

11. The mask blank according to claim 1, wherein the difference in the oxygen content between the etching mask film and the etching stopper film is 40 atom % or less.

12. The mask blank according to claim 1, wherein the light shielding film includes a structure in which a lower layer and an upper layer are laminated in said order from the transparent substrate side, and wherein the upper layer is formed from a material containing tantalum and oxygen.

13. The mask blank according to claim 1, wherein the light shielding film includes a structure in which a lower layer and an upper layer are laminated in said order from the transparent substrate side, and wherein the upper layer is formed from a material containing transition metal, silicon, and nitrogen.

14. A method for manufacturing a transfer mask using the mask blank according to claim 1, comprising:

forming, on the etching mask film, a first resist film having a first pattern including a transfer pattern and an alignment mark pattern to be formed in the light semitransmissive film;

forming the first pattern in the etching mask film by dry etching with an oxygen-containing chlorine-based gas, using the first resist film as a mask;

after removing the first resist film, forming the first pattern in the light shielding film by dry etching with a fluorine-based gas, using as a mask the etching mask film having the first pattern;

forming the first pattern in the etching stopper film while leaving the etching mask film having the first pattern by dry etching with the oxygen-containing chlorine-based gas, using as a mask the light shielding film having the first pattern;

forming, on the etching mask film, a second resist film having a second pattern including a light shielding band pattern to be formed in the light shielding film;

forming the second pattern in the etching mask film by dry etching with the oxygen-containing chlorine-based gas, using the second resist film as a mask;

after removing the second resist film, performing dry etching with the fluorine-based gas to form the first pattern in the light semitransmissive film, using as a mask the etching stopper film having the first pattern, and form the second pattern in the light shielding film, using as a mask the etching mask film having the second pattern; and performing dry etching with the oxygen-containing chlorine-based gas to remove the etching mask film and remove the etching stopper film from a region where the light shielding film is not left.

15. The method for manufacturing a transfer mask according to claim 14, wherein in the forming the first pattern in the light semitransmissive film, the dry etching with the fluorine-based gas containing no carbon is performed.

16. The method for manufacturing a transfer mask according to claim 15, wherein in the forming the first pattern in the light shielding film, the dry etching with the fluorine-based gas containing carbon is performed.

17. A method for manufacturing a semiconductor device, comprising setting a transfer mask manufactured by the method for manufacturing a transfer mask according to claim 14 on a mask stage of an exposure apparatus to perform exposure transfer to a resist film on a semiconductor device.

18. A transfer mask having a structure in which a light semitransmissive film, an etching stopper film, a light shielding film, and an etching mask film are laminated in said order on a transparent substrate, wherein the light semitransmissive film is made of a material containing silicon and nitrogen and has a pattern including a transfer pattern and an alignment mark pattern formed therein, and wherein the light shielding film is made of at least one of a material containing tantalum and a material containing transition metal and silicon, and wherein a pattern including a light shielding band pattern and an alignment mark pattern is formed in each of the etching stopper film and the light shielding film, and wherein the etching mask film and the etching stopper film are made of a material containing chromium, and wherein a chromium content in the etching mask film is greater than a chromium content in the etching stopper film, and wherein an oxygen content in the etching mask film is less than an oxygen content in the etching stopper film, and wherein the etching mask film has a thickness greater than a thickness of the etching stopper film.

19. A method for manufacturing a semiconductor device, comprising setting the transfer mask according to claim 18 on a mask stage of an exposure apparatus to perform exposure transfer to a resist film on a semiconductor device.

20. The transfer mask according to claim 18, wherein the light semitransmissive film contains at least one gas selected from the group consisting of helium (He), argon (Ar), krypton (Kr), and xenon (Xe).

* * * * *